(12) United States Patent
Jalade et al.

(10) Patent No.: US 6,326,648 B1
(45) Date of Patent: Dec. 4, 2001

(54) POWER SWITCH WITH A CONTROLLED DI/DT

(75) Inventors: Jean Jalade, Castanet-Tolosan; Jean-Louis Sanchez, Escalquens; Jean-Pierre Laur, Albi; Marie Breil, Toulouse; Patrick Austin, L'Union; Eric Bernier, Mettray; Mathieu Roy, Joue les Tours, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/467,357

(22) Filed: Dec. 20, 1999

(51) Int. Cl.$^7$ .......................... H01L 29/74; H01L 31/111
(52) U.S. Cl. .......................... 257/130; 257/139; 257/140
(58) Field of Search .................................. 257/135, 139, 257/140

(56) References Cited

U.S. PATENT DOCUMENTS 5,349,212 * 9/1994 Seki .
5,381,025 * 1/1995 Zommer .
5,463,231 * 10/1995 Ogura et al. .

FOREIGN PATENT DOCUMENTS

A-0 559 945    9/1993    (EP) ............................. H01L/29/74

WO 99/17374    4/1999    (WO) ........................... H01L/31/111

OTHER PUBLICATIONS

Lendenmann H., et al. "Switching Behavior and Current Handling Performance of MCT–IGBT Cell Ensembles" Proceedings of the International Electron Devices Meeting, Washington, Dec. 8–11, 1991, pp. 91/149–152, Institute of Electrical and Electronics Engineers.

Patent Abstracts of Japan, vol. 097, No. 001, Jan. 31, 1997 & JP 08 241980 A (Fuji Electric Co. Ltd.).

Patent Abstracts of Japan, vol. 012, No. 246 (E–632), Jul. 12, 1988 & JP 63 036568 A (Toshiba Corp.).

* cited by examiner

Primary Examiner—Stephen D. Meier
(74) Attorney, Agent, or Firm—Wolf, Greenfield & Sacks, P.C.; James H. Morris (57) ABSTRACT

A monolithic power switch with a controlled di/dt including the parallel assembly of a MOS or IGBT type component with a thyristor type component, including means for inhibiting the thyristor type component during the closing phase of the switch, which is ensured by the IGBT type component. The IGBT type component has a vertical multicell structure and the component of thyristor type has a vertical monocell structure.

14 Claims, 5 Drawing Sheets

POWER SWITCH WITH A CONTROLLED DI/DT

BACKGROUND OF THE INVENTION

1. Field of the Invention

The present invention relates to the field of power regulation. To control the operation of industrial and domestic appliances, semiconductor power components operating in switched mode are often used. So-called conduction angle (or phase angle) controls are thus made, in which a power switch is turned on only for a portion of the duration of each halfwave or of every other halfwave of the supply voltage. Such systems are currently used in the field of domestic lighting to make light dimmers, and in many other applications to form power variators.

2. Discussion of the Related Art

Phase angle power regulation has the well known disadvantage of generating harmonics on the mains due to the fact that the switch closes while a relatively high voltage is present thereacross. These harmonics cause electromagnetic disturbances and are a major problem. Various standards have been developed to require manufacturers to avoid generating such disturbances. A simple way of avoiding the reinjection of harmonics onto the mains is to filter them. However, the addition of a passive filter to a variator is a serious handicap in terms of size, weight and cost. To avoid this filter, it has also been devised to tackle the problem from the base by controlling the current variation speed (di/dt) upon switchings. Unfortunately, neither a thyristor, nor a triac which are ideal components to manufacture a variator due to their robustness, their breakdown voltage, their easy switching and their small on-state dissipated power enable this di/dt control.

Figure 1:
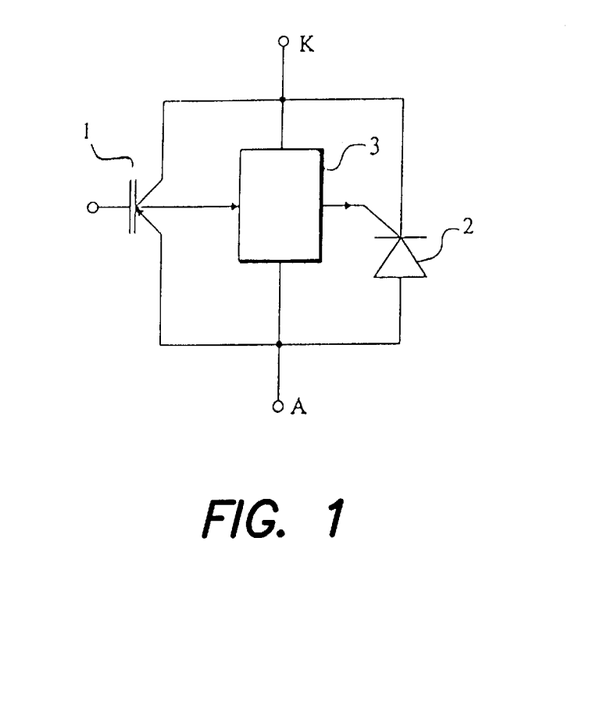
FIG. 1 shows a general conventional diagram of a switch with a controlled di/dt.

It has thus been provided, in the art, to use systems of the type schematically shown in FIG. 1, which include power components 1 and 2 in parallel. Component 1 is a component such that the variation of the main current upon turning-on is linked to the variation of the control voltage, for example, a power MOS transistor or an isolated-gate bipolar transistor (IGBT). Component 2 is a component of thyristor or triac type which has the advantage, once on, of exhibiting a very small on-state current drop and which further has the advantage of automatically turning off when the current flowing therethrough becomes substantially zero. Thus, it has been attempted to make switches such that their closing is caused by a component of the type of component 1 while most of the on phase and the turning-off are ensured by a component of the type of component 2. A control circuit 3 is accordingly provided to turn on the second component, of thyristor type, once the first component, of MOS or IGBT type, has been turned on.

Given that a MOS- or IGBT-type power transistor is a component having a multicell structure, it has generally been tried to associate, with each of the cells of the MOS component, a structure having the thyristor function. The general structure thus is of multicell type.

SUMMARY OF THE INVENTION

The present invention is based on the recognition by the present inventors of the fact that such structures of multicell type have various disadvantages. A first disadvantage is that, for a given maximum current, a multicell type thyristor will inevitably have a larger surface than a monocell thyristor. Another disadvantage is that the connections often are most difficult to make between various cells of a multicell component than with monocell components, which requires increasing the number of metallization levels.

Thus, an object of the present invention is to provide a circuit and a structure of a switch with a controlled di/dt which associates, with a MOS or IGBT transistor of multicell type, a monocell power component of thyristor type, to obtain a component of minimum surface for a given maximum current.

To achieve these and other objects, the present invention provides a monolithic power switch with a controlled di/dt including the parallel assembly of a MOS or IGBT type component with a thyristor type component, including means for inhibiting the thyristor type component during the closing phase of the switch, which is ensured by the IGBT type component. The IGBT type component has a vertical multicell structure and the thyristor type component has a vertical monocell structure.

According to an embodiment of the present invention, the switch is formed in a substrate of a first conductivity type, the rear surface of which includes a region of the second conductivity type. This component includes on the upper surface side first cells of vertical MOS or IGBT type, second cells of vertical MOS or IGBT type, and a cathode gate well of the second conductivity type containing a cathode region of a main thyristor and a cathode region of an auxiliary thyristor. The cathode region of the second cells is connected to the cathode and cathode-gate regions of the auxiliary thyristor, the cathode and cathode gate regions of the main thyristor are connected to a cathode terminal and the area of the well included between the cathode regions of the main and auxiliary thyristors is coated with an isolated gate.

According to an embodiment of the present invention, the switch is formed in a substrate of a first conductivity type, the rear surface of which includes a region of the second conductivity type. This component includes on the upper surface side first cells of vertical MOS or IGBT type, and second cells combining structures of vertical MOS or IGBT type and a vertical auxiliary thyristor structure, these second cells being formed in regions of the second conductivity type and containing two rings of the first conductivity type, the first ring being separated from the second one by a first isolated gate and being connected to the central portion of said region by a metallization, and the second ring being separated from the periphery of the region by a second isolated gate connected to the gate of the first cells.

According to an embodiment of the present invention, the switch further includes a diode of vertical type biased inversely to the thyristor biasing.

According to an embodiment of the present invention, the inhibiting means include a MOS transistor connected between the thyristor gate and cathode.

According to an embodiment of the present invention, the switch includes self-biasing means of the MOS transistor.

The foregoing objects, features and advantages of the present invention will be discussed in detail in the following non-limiting description of specific embodiments in connection with the accompanying drawings.

DETAILED DESCRIPTION

Figure 2:
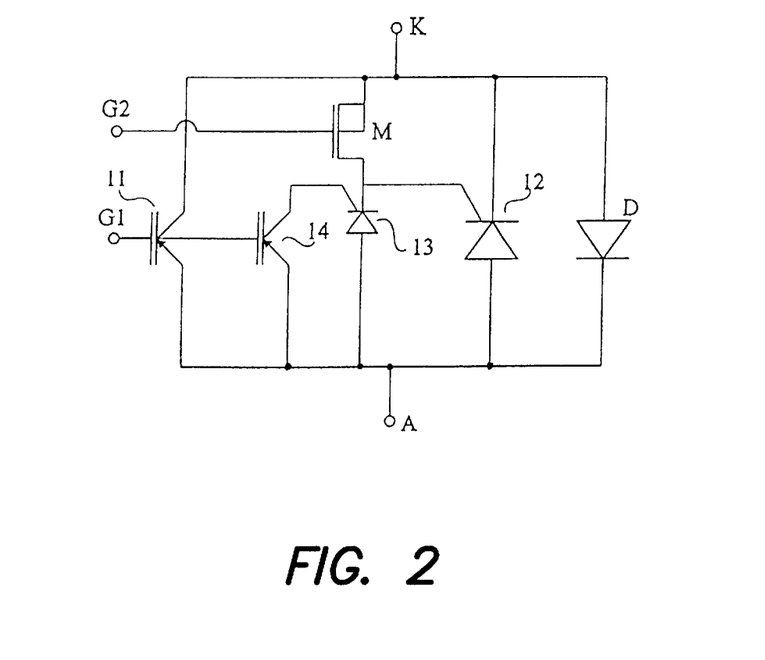
FIG. 2 schematically shows a circuit that the present invention aims at implementing.

FIG. 2 shows an example of a controlled di/dt switch circuit according to the present invention. This switch includes a power transistor of IGBT type 11 (isolated gate bipolar transistor) and a power thyristor 12. The two components are connected in parallel between an anode A and a cathode K. The anode of thyristor 12 and the anode of IGBT 11 are connected to anode A. The cathode of thyristor 12 and the cathode of IGBT 11 are connected to cathode K. In this embodiment, a diode D is connected in antiparallel on thyristor 12 between terminals A and K. IGBT 11 is connected to a first control terminal by its gate G1. Components 11 and 12 are interconnected by a control circuit including a pilot thyristor 13, the anode of which is connected to the anode of thyristor 12 and the cathode of which is connected to the gate of thyristor 12. The cathode of thyristor 13 is connected to cathode K via a MOS transistor M, the gate G2 of which is connected to a second control terminal. The gate of thyristor 13 is connected to its anode via a second IGBT 14, the gate of which is connected to terminal G1. It should be understood that components M, 13 and 14 are components of low power and thus of small surface as compared to components 11, 12 and D.

Figure 3:
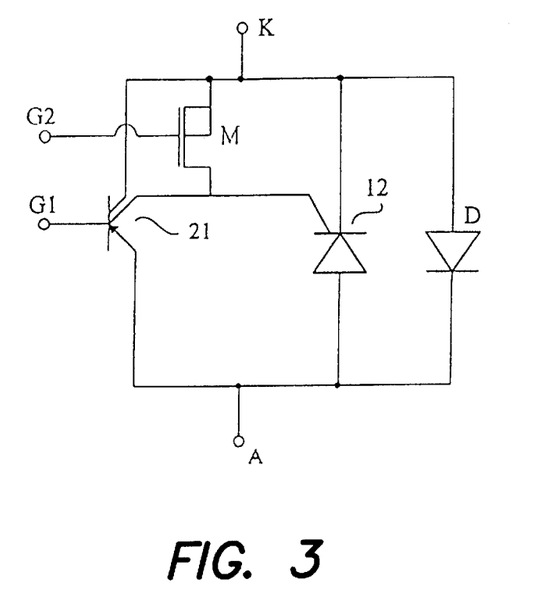
FIG. 3 is another representation of the circuit of FIG. 2.

FIG. 3 is another illustration of the circuit of FIG. 2. It shows diode D, thyristor 12, and MOS transistor M. The assembly of IGBT 11, IGBT 14, and pilot thyristor 13 is replaced with an IGBT 21 with two cathodes, the first one of which is connected as in the preceding drawing, and the second one of which is directly connected to the gate of thyristor 12.

Figure 4:
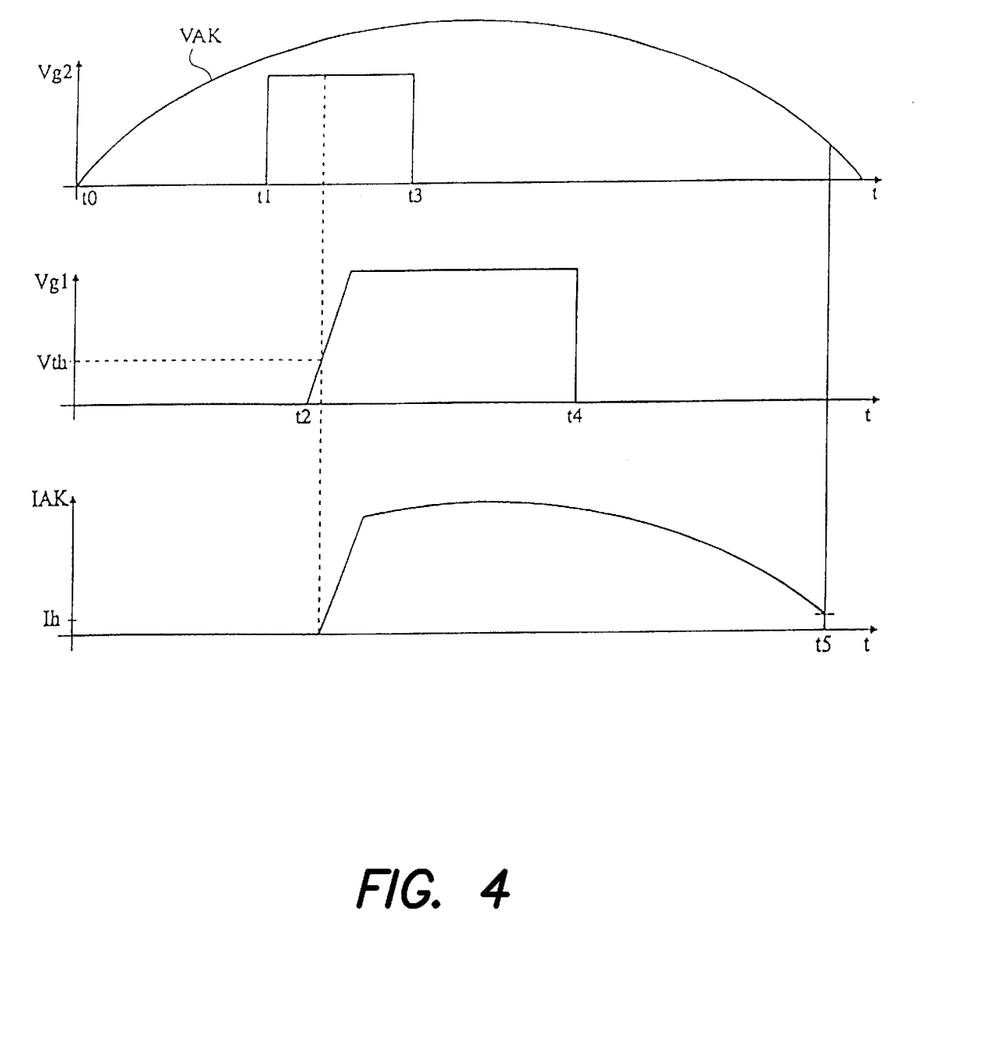
FIG. 4 shows control signals of a component according to the present invention.

The operation of the circuit of FIG. 2 or 3 will be explained in relation with FIG. 4, which shows voltage Vg2 on gate G2, voltage Vg1 on gate G1, and current $I_{AK}$ between anode A and cathode K. A positive halfwave of voltage $V_{AK}$ between terminals A and K is considered.

At a time t1, slightly after the beginning t0 of a positive halfwave of the mains voltage, gate G2 of transistor M is controlled to turn it on, so that the gate and the cathode of thyristor 12 are short-circuited and this thyristor cannot turn on. At a time t2, subsequent to time t1 and chosen according to the desired conduction angle, a voltage ramp is applied on gate G1 of transistor 11, the slope of which is controlled to obtain the desired di/dt. This ramp results, for example, from the application of a square signal through an RC filter (of low power since it is a control signal). As soon as the voltage on terminal G1 exceeds a threshold value Vth, current $I_{AK}$ starts progressively increasing to a value corresponding to a full conduction. Then, at a time t3, the signal on gate G2 is cut off to turn off transistor M and the cathode current of IGBT 14 (or the current of the auxiliary cathode of IGBT 21) triggers thyristor or 13 (or 12). Thyristor 12 turns on and its conduction dominates over that of IGBT 11 or 21 since, generally, a thyristor has a smaller voltage drop than a MOS or IGBT power transistor. Then, at a time t4, the signal on gate G1 is cut off, so that IGBTs 11 and 14 definitively turn off. Thus, at the end of the halfwave, at time t5, when voltage $V_{AK}$ becomes too small, current $I_{AK}$ falls under a threshold value Ih and the thyristor turns back off. The voltage of gate G1 has been interrupted to avoid the turning back on of the IGBT.

Figure 5:
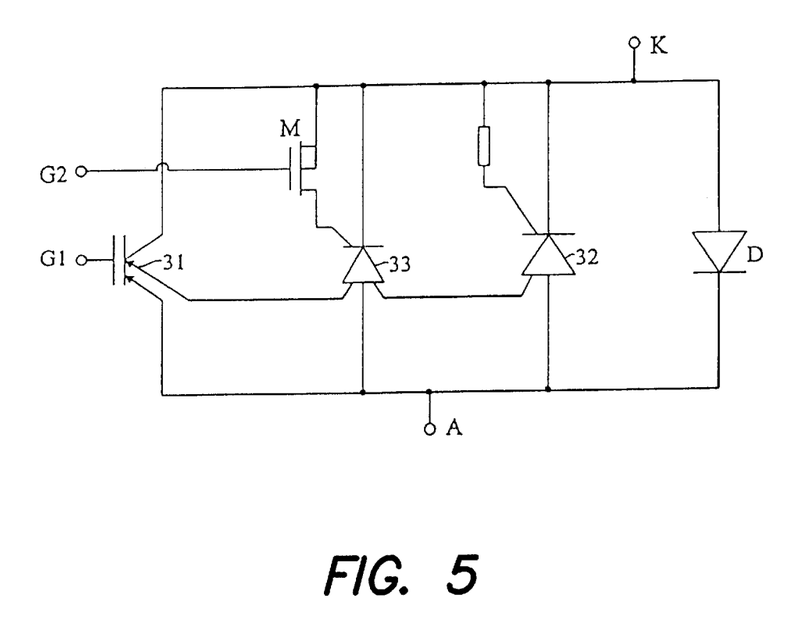
FIG. 5 shows another circuit that the present invention can implement.

FIG. 5 shows another possible embodiment of the present invention in which anode gate thyristors are used rather than cathode gate thyristors. This circuit includes inverse diode D. The main cathode gate thyristor 12 is replaced with a main anode-gate thyristor 32. Cathode gate pilot thyristor 13 is replaced with an anode-gate thyristor 33 and an IGBT 31, the anode of which is also used as an anode gate of pilot thyristor 33, is used. The cathode gate of the pilot thyristor is connected to its cathode via an N-channel enrichment MOS transistor M.

According to an advantage of the present invention, the circuits described on the one hand in FIGS. 2 and 3, and on the other hand in FIG. 5, enable realizations in the form of monolithic components.

Figure 6:
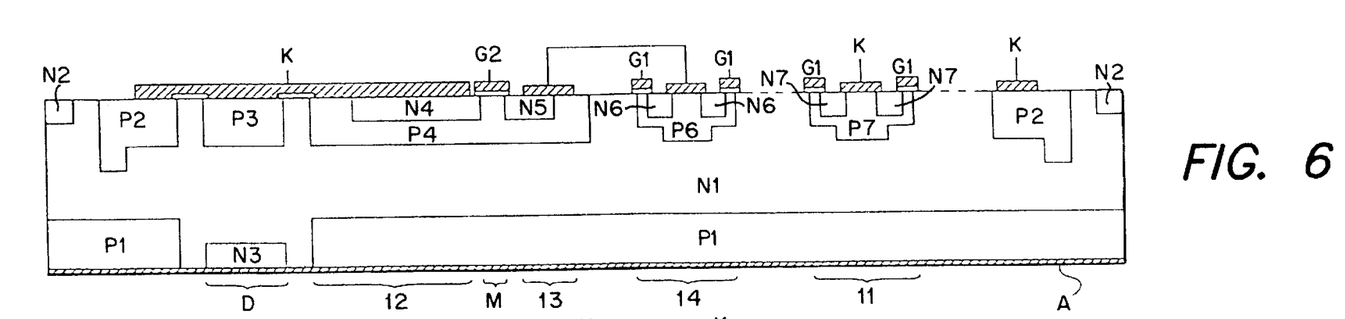
FIG. 6 is a simplified cross-section view of an embodiment of a monolithic component implementing the circuit of FIGS. 2 and 3.

FIG. 6 shows a possible realization of the circuit of FIG. 2 or 3. The component is formed in an N-type silicon wafer N1. At the periphery of this wafer, on the upper surface side, an N-type ring N2 is located completely towards the outside, and, more to the inside, a P-type ring P2 is connected to cathode K. This is a conventional voltage withstand system. On the rear surface side, in front of regions N2 and P2 is formed a heavily-doped P-type layer P1.

Diode D corresponds to a region P3 formed on the front surface side, in front of which is located, on the rear surface side, a heavily-doped N-type region N3. Main thyristor 12 includes on the upper surface side an N-type region N4 formed in a P-type well P4. On the rear surface side, as well as for all components which will be mentioned hereafter, is located P-type region P1. The only N-type region of the rear surface is above-mentioned cathode region N3 of diode D. A main thyristor N4-P4-N1-P1 has thus been formed. Auxiliary thyristor 13 is a vertical thyristor, the cathode of which corresponds to an N-type region N5 also formed in well P4. Thus, auxiliary thyristor 13 includes regions N5-P4-N1-P1. A portion at least of region P4 between regions N4 and N5 is coated with an isolated gate G2, regions N4-P4-N5 corresponding to N-channel enrichment MOS transistor M. IGBT 14 is a multicell component, each cell of which conventionally includes a ring-shaped source region N6 formed in a well P6. The periphery of well P6, between region N6 and the outside of well P6, is covered with a gate G1, as is conventional. Thus, given that the rear surface is coated with a P-type layer P1, a vertical IGBT has been formed, the cathode of which corresponds to a metallization formed on regions P6 and N6, the gate of which corresponds to metallization G1 and the anode of which corresponds to the rear surface of the component. Similarly, main IGBT 11 includes cells, each of which includes in a well P7 a ring-shaped source region N7.

A first upper surface metallization connected to terminal K covers regions P2, P3, N4, and N7-P7. Metallization K also covers a portion of well P4 opposite to gate G2. Another upper surface metallization, not connected to an external source, covers region N5 and a portion of well P4 distant from gate G2, as well as wells P6 and sources N6.

It should be noted that IGBT 11 of FIG. 2 corresponds to a great number of cells formed in wells P7, that IGBT 14 corresponds to a smaller number of cells formed in wells P6, but that thyristors 12 and 13, MOS M, and diode D are monocell components.

In an initial step, starting from time t2 when gates G1 and G2 are biased, the cells corresponding to wells P7 are conductive. As concerns the cells corresponding to wells P6, the conduction is done from anode A to the metallization covering sources N6, towards region N5, then towards region N4 and cathode K since, due to the biasing of gate G2, it may be assumed that regions N4 and N5 are interconnected. During this phase, the conduction of the thyristors is inhibited.

Starting from time t3, when gate G2 is no longer biased, the current can no longer flow from region N5 to region N4 via the channel formed under gate G2, but closes by passing through region P4 under regions N4 and N5. This current flow successively triggers thyristors N5-P4-N1-P1 and N4-P4-N1-P1. From the time when this latter thyristor turns on, most of the current flows therethrough. It will be necessary that the IGBTs do not have too small an on-state resistance, to avoid delaying or inhibiting the triggering of the thyristors.

Figure 7:
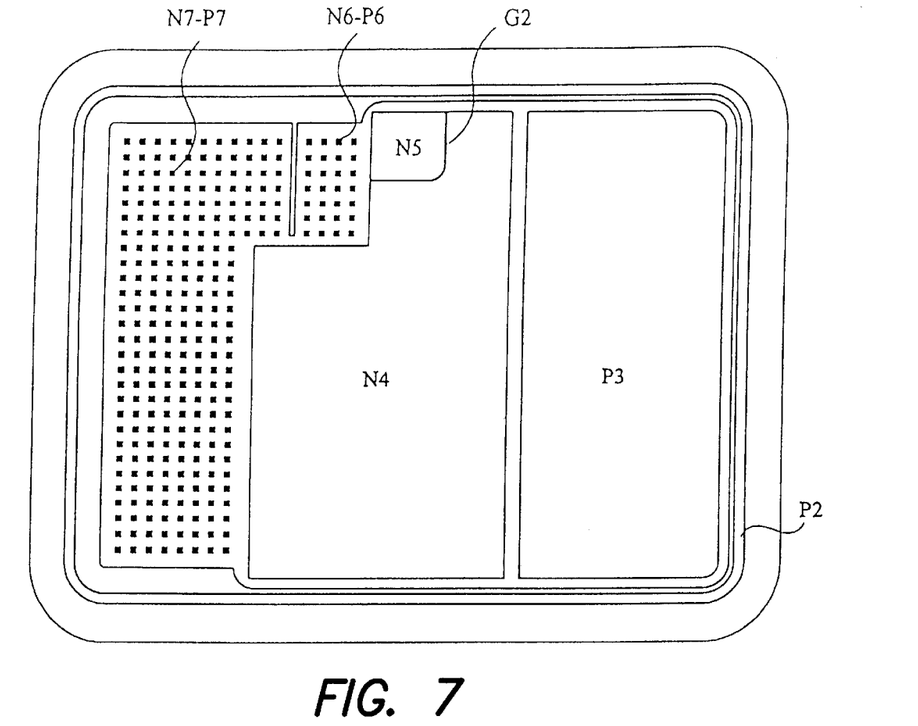
FIG. 7 is an example of a top view of the component of FIG. 6.

FIG. 7 shows a very simplified top view of an embodiment of the circuit of FIG. 6. Same elements are designated by same references. This drawing essentially has the function of showing the monocell nature of elements D, 12, M and 13 and the multicell nature of IGBTs 11 and 14. The IGBT cells are very symbolically shown as black squares. Gate G1 extends between these cells. Conversely, gate G2 is shown in the form of a simple line separating regions N4 and N5.

Figure 8:
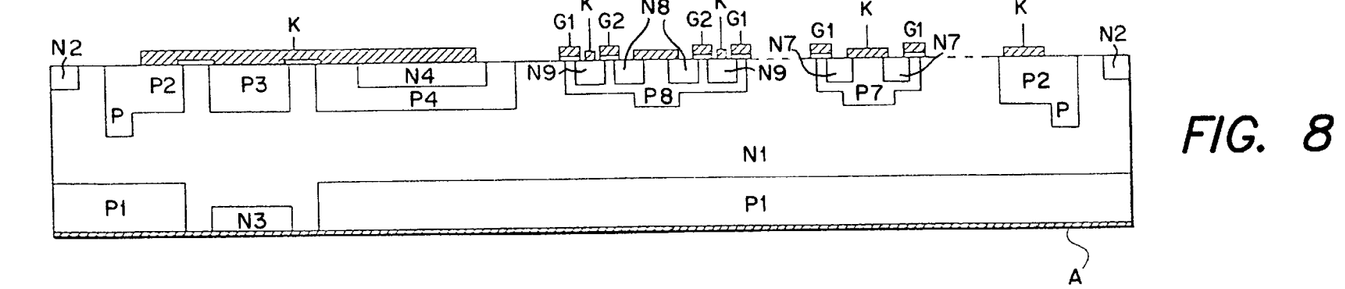
FIG. 8 is a simplified cross-section view of an embodiment of a monolithic component implementing the circuit of FIG. 5.

FIG. 8 shows a monolithic embodiment of the circuit of FIG. 5. The component periphery, diode D (P3-N1-N3) and main thyristor N4-P4-N1-P1 have the same structure as in FIG. 6. Similarly, the main IGBT, formed on the upper surface side of cells P7-N7, is identical to that of FIG. 6. The intermediary circuit of conduction transfer from the IGBT to the thyristor is however different. It is formed in a well P8 and includes in this well two successive N-type rings N8 and N9. Regions N8 and the central portions of wells P8 are connected to a metallization not connected to an external terminal while regions N9 are connected to cathode K. The area between the outside of external ring N9 and the external periphery of well P8 is coated with a gate G1. The interval between ring regions N8 and N9 is coated with a gate G2. Gates G1 and G2 are controlled as described in relation with FIGS. 4 and 6.

As previously, in an initial state, when gates G1 and G2 are biased, the main IGBT corresponding to cells N7-P7 is on and the cells corresponding to wells P8 are also conductive. When the signal applied on gate G2 is interrupted, the short-circuit between cathode N9 and base P8 is eliminated and auxiliary thyristor N8-P8-N1-P1 turns on. If this thyristor is sufficiently close to the main thyristor, the injection at the level of junction P1-N1 also results in turning on main thyristor N4-P4-N1-P1 which here triggers in anode-gate mode.

Figure 9:
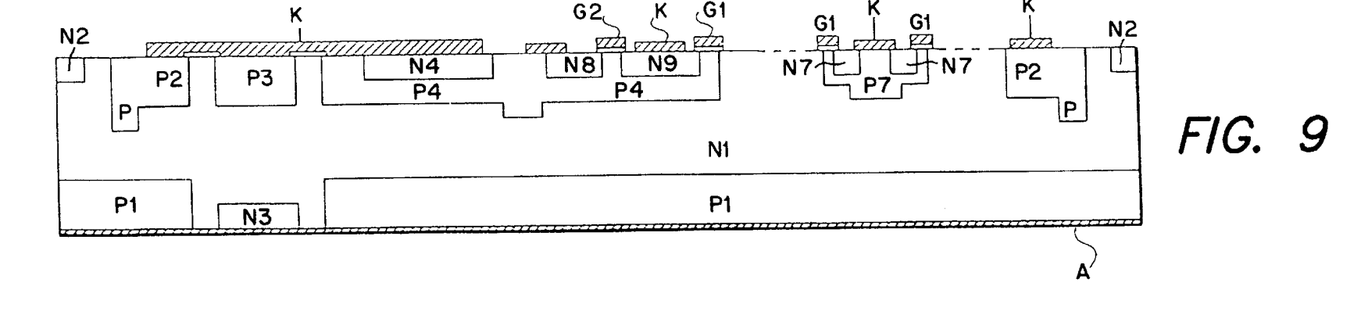
FIG. 9 is a simplified cross-section view of another embodiment of a monolithic component implementing the circuit of FIGS. 2 and 3.

FIG. 9 illustrates a structure which is close to that of FIG. 8, but in which the main thyristor control is of cathode-gate type. The structure of FIG. 9 corresponds to a modification of the structure of the drawing in which wells P8, instead of forming multiple cells, form a peripheral extension of well P4. In well P4 are formed distinct peripheral areas N8 and N9, area N9 being the most external one. An isolated gate G1 tops the periphery of well P4, outside area N9. Area N9 is connected to metallization K. A gate G2 extends between areas N8 and N9. A metallization connects area N8 to well P4, on the side of region N4.

The operation of the structure of FIG. 9 is similar to that of FIG. 8 when gates G1 and G2 cause an on state. When the signal on gate G2 is interrupted, the short-circuit between cathode N9 and base P4 is interrupted and coupling thyristor N9-P4-N1-P1 turns on. The generation of carriers in base P4 then results in the turning-on of main thyristor N4-P4-N1-P1.

Figures 10, 11:
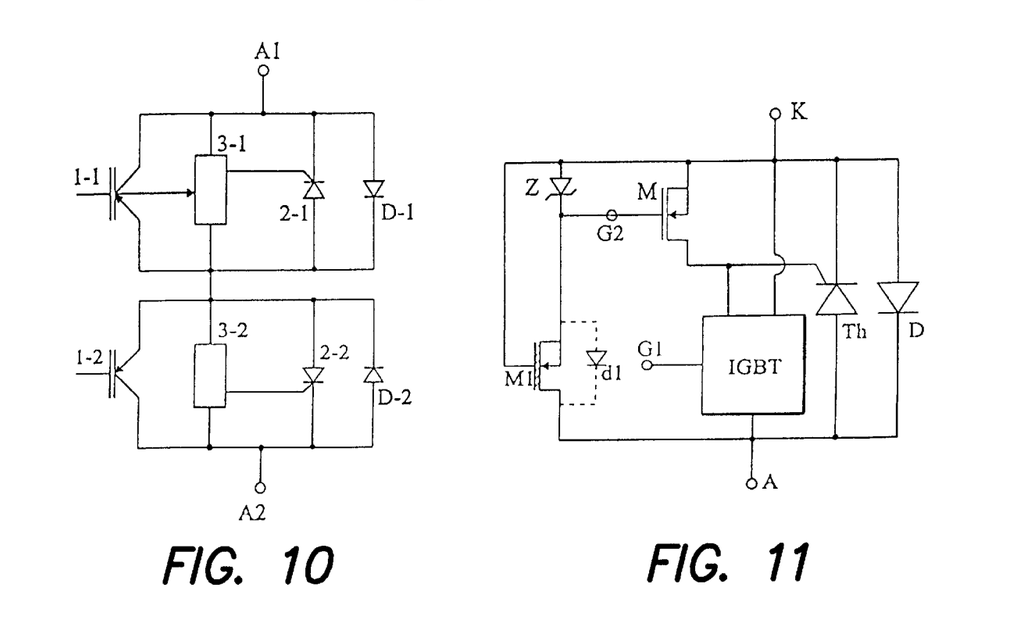
FIG. 10 shows a series assembly in opposition of two switches according to the present invention.
FIG. 11 illustrates an alternative control of a switch according to the present invention.

FIG. 10 shows the series connection in opposition, between two terminals A1 and A2, of two components according to the present invention to form a bidirectional switch with a controlled di/dt. In this case, the advantage of providing inverse diodes D is obvious. The upper component, biased like the previously described components, includes a main IGBT 1-1, a main thyristor 2-1, an inverse diode D-1 and a control circuit 3-1 formed in one or the other of the previously described ways. The lower component includes corresponding reverse-biased elements 1-2, 2-2, 3-2 and D-2. Thus, when terminal A1 is positive, the conduction is performed via diode D-1, then via the lower component. When terminal A1 is negative, the connection is performed via diode D-2, then via the upper component.

In the foregoing, for an A.C. operation, the series association in opposition of two components, each including an antiparallel diode, has been described in relation with FIG. 10. This type of component association is presently preferred, since IGBT transistors generally have trouble withstanding a relatively high reverse voltage. However, if, with the progress of technology, it becomes possible to manufacture IGBT transistors with a sufficient reverse breakdown voltage at reasonable costs, it will be possible to place two components according to the present invention, without reverse diode D, in antiparallel to form an A.C. current control device.

An alternative of the present invention is schematically illustrated in FIG. 11. In the foregoing description, the switch according to the present invention includes two control terminals G1 and G2, control terminal G1 being that which is used to determine the conduction duty cycle of the switch and terminal G2 being a functional terminal only intended for blocking the component of thyristor type at the beginning of each halfwave. It may be provided that the signal on terminal G2 is automatically provided by components easily integrable in the monolithic structure incorporating the other components forming the switch according to the present invention. A simplified example of a circuit performing this function is illustrated in FIG. 11.

In FIG. 11, diode D is the same as that of FIGS. 2, 3, and 5, and thyristor Th symbolically shows thyristors 12 and 13 of FIG. 2, thyristor 12 of FIG. 3, or thyristors 32 and 33 of FIG. 5. The IGBT block corresponds to elements 11 and 14 of FIG. 2, to element 21 of FIG. 3, or to element 31 of FIG. 5. The originality of the circuit of FIG. 11 is the connection mode of gate terminal G2 of MOS transistor M used to avoid the conduction of thyristor Th in an initial phase. According to this alternative of the present invention, gate G2 is connected to a self-biasing system, intended for turning on transistor M in an initial phase of each voltage halfwave applied between terminals A and K. This automatic biasing system for example includes, as shown, the series connection between terminals A and K of a depletion MOS transistor M1 and of a zener diode Z. The gate of transistor M1 is connected to terminal K. Thus, when a voltage on terminal K starts from a zero value, and starts increasing, transistor M1 conducts and charges the gate of transistor M. As soon as voltage $V_{AK}$ becomes greater than threshold voltage $Vth_M$ of transistor M, this transistor conducts and short-circuits the gate-cathode junction of thyristor Th. This thyristor must not be too sensitive, to avoid being triggered before this turning on of transistor M. Zener diode Z has a protective function and ensures that the voltage on gate M does not exceed a predetermined value. Then, as described previously, once a control voltage is applied on gate G1, the IGBT transistor turns on and the voltage between terminals A and K falls to a small value, which becomes smaller than threshold voltage $Vth_M$. As an example, saturation values such that $V_{AK}$ is on the order of 1.5 to 2 volts may be reached, while $Vth_M$ may be chosen at a value on the order of 3 to 4 volts. The gate-source capacitor of transistor M then discharges through structural diode d1 in antiparallel on MOS transistor M1, which blocks transistor M and enables the gate of thyristor Th to be supplied and, as described previously, the conduction is now ensured by thyristor Th rather than by the IGBT. Of course, this structure is likely to have various alternatives. For example, depletion transistor M1 may be replaced with a non-linear resistor. It is then necessary to provide a real anti-parallel diode d1.

Of course, the present invention is likely to have various alterations, modifications, and improvements which will readily occur to those skilled in the art. In particular, all previously-described types of conductivity may be inverted, with the biasings being modified accordingly. Further, various known alternatives may be used for each of the previously-described components, provided that they ensure the same function as that mentioned hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic power switch with a controlled di/dt including:
   a transistor;
   a thyristor type component connected in parallel with the transistor;
   means for inhibiting the thyristor type component during a closing phase of the switch, the closing phase being ensured by transistor; and
   wherein the transistor has a vertical multicell structure and the thyristor type component has a vertical monocell structure.

2. The monolithic switch of claim 1, further including a diode of vertical type biased inversely to a biasing of the thyristor.

3. The monolithic power switch of claim 1, wherein the means for inhibiting the thyristor type component includes a MOS transistor connected between a gate of the thyristor and a cathode of the thyristor.

4. The monolithic power switch of claim 3, including means for self-biasing the MOS transistor.

5. The monolithic power switch of claim 1, wherein the transistor is a MOS type component.

6. The monolithic power switch of claim 1, wherein the transistor is a IGBT type component.

7. The monolithic power switch of claim 1, formed in a substrate of a first conductivity type having a rear surface including a region of a second conductivity type, the switch comprising:
   an auxiliary thyristor having a cathode and a cathode-gate region;
   a first plurality of cells forming part of the transistor and disposed on an upper surface side of the substrate;
   a second plurality of cells forming part of the transistor and disposed on an upper surface side of the substrate, the second plurality of cells having a cathode region; and
   a cathode gate well containing a cathode of the thyristor and the cathode of the auxiliary thyristor;
   wherein the cathode region of the second plurality of cells is connected to the cathode of the auxiliary thyristor and to the cathode-gate region of the auxiliary thyristor; and
   wherein the cathode of the thyristor and a cathode-gate of the thyristor are connected to a cathode terminal; and
   wherein an area of the cathode gate well disposed between the cathode of the thyristor and the cathode of the auxiliary thyristor is coated with an isolated gate.

8. The monolithic power switch of claim 1, formed in a substrate of a first conductivity type having a rear surface including a first region of a second conductivity type, the switch comprising:
   an auxiliary thyristor;
   a first plurality of cells disposed on an upper surface side of the substrate and forming part of the transistor, the first plurality of cells having a gate; and
   a second plurality of cells formed in a second region of the second conductivity type, the second plurality of cells forming part of the transistor and part of the auxiliary thyristor;
   wherein the second region of the second conductivity type contains first and second rings of the first conductivity type separated by a first isolated gate, the first isolated gate connected to a central portion of the second region by a metallization; and
   wherein the second ring is separated from a periphery of the second region by a second isolated gate, the second isolated gate connected to the gate of the first plurality of cells.

9. A monolithic power switch having a controlled di/dt comprising:
   a power transistor;
   a power thyristor connected in parallel with the power transistor; and
   a control circuit connected between the power transistor and the power thyristor to inhibit the thyristor during a closing phase of the switch.

10. The monolithic power switch of claim 9, further including a diode having an anode connected to a cathode of the thyristor, and a cathode connected to an anode of the thyristor.

11. The monolithic power switch of claim 10, formed in a substrate of a first conductivity type, comprising:
   a first region of a second conductivity type disposed on a lower surface of the substrate of the first conductivity type;
   a plurality of first cells disposed on an upper surface of the substrate, each cell including a respective ring-shaped region of the first conductivity type disposed in a second region of the second conductivity type, the cells forming part of the power transistor, the power transistor having a multicell structure;

a first region of the first conductivity type disposed in a well of the second conductivity type disposed on the upper surface of the substrate to form part of the power thyristor, the thyristor having a monocell structure; and a third region of the second conductivity type formed on the upper surface of the substrate, and a first heavily doped region of the first conductivity type disposed on the lower surface of the substrate, said regions forming the diode.

12. The monolithic power switch of claim 11, wherein the control circuit comprises:

a plurality of second cells disposed on the upper surface of the substrate, each cell including second and third rings of the first conductivity type, the rings being disposed in a fourth region of the second conductivity type, the second ring being separated from the third ring by a first isolated gate and connected to a central portion of the fourth region by a fourth metallization, and the third ring being separated from a periphery portion of the fourth regions by a second isolated gate, the second isolated gate being connected to the first metallization.

13. The monolithic power switch of claim 9, formed in a substrate of a first conductivity type, comprising:

a first region of a second conductivity type disposed on a lower surface of the substrate of the first conductivity type;

a plurality of first cells disposed on an upper surface of the substrate, each cell including a respective ring-shaped region of the first conductivity type disposed in a second region of the second conductivity type, the cells forming part of the power transistor, the power transistor having a multicell structure;

a first region of the first conductivity type disposed in a well of the second conductivity type disposed on the upper surface of the substrate to form part of the power thyristor, the thyristor having a monocell structure;

a first metallization disposed above the plurality of first cells, isolated from the ring-shaped region of the first conductivity type and the second region of the second conductivity type, to provide a gate of the transistor, a second metallization contacting at least the first region of the first conductivity type and the second region of the second conductivity type to provide a common cathode of the thyristor and the transistor; and a third metallization contacting the first region of the second conductivity type to provide a common anode of the transistor and the thyristor.

14. The monolithic power switch of claim 13, wherein the control circuit comprises:

a plurality of second cells disposed on the upper surface of the substrate, each cell including a respective second ring-shaped region of the first conductivity type disposed in a third region of the second conductivity type.

* * * * *

UNITED STATES PATENT AND TRADEMARK OFFICE
CERTIFICATE OF CORRECTION

PATENT NO. : 6,326,648 B1
DATED : December 4, 2001
INVENTOR(S) : Jean Jalade, Jean-Louis Sanchez, Jean-Pierre Laur, Marie Breil, Patrick Austin, Eric Bernier and Roy Mathieu It is certified that error appears in the above-identified patent and that said Letters Patent is hereby corrected as shown below:

<u>Title page,</u>
Item [30] should read:
-- [30] Foreign Application Priority Data
Dec. 31, 1998 [FR] France ....................98 16771 --

Signed and Sealed this

Twenty-first Day of May, 2002

Attest:

Attesting Officer

JAMES E. ROGAN
Director of the United States Patent and Trademark Office